(12) United States Patent
Van Elp et al.

(10) Patent No.: US 6,864,957 B2
(45) Date of Patent: Mar. 8, 2005

(54) CHUCK, LITHOGRAPHIC PROJECTION APPARATUS, METHOD OF MANUFACTURING A CHUCK AND DEVICE MANUFACTURING METHOD

(75) Inventors: Jan Van Elp, Delft (NL); Peter Giesen, Den Haag (NL); Jacob Jan Van der Velde, Rijswijk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/424,978

(22) Filed: Apr. 29, 2003

(65) Prior Publication Data

US 2004/0012767 A1 Jan. 22, 2004

(30) Foreign Application Priority Data

May 1, 2002 (EP) ............................................. 02253073

(51) Int. Cl.[7] .............................................. G03B 27/42
(52) U.S. Cl. .............................. 355/53; 355/72; 361/234
(58) Field of Search ............................. 355/53, 72, 75, 355/76; 361/234; 219/502

(56) References Cited

U.S. PATENT DOCUMENTS

| | | | |
|---|---|---|---|
| 5,835,333 A | 11/1998 | Castro et al. | 361/234 |
| 5,954,982 A | 9/1999 | Sogard | 219/502 |
| 6,368,942 B1 | 4/2002 | Cardinale | 438/459 |
| 6,542,224 B2 * | 4/2003 | Ackerman et al. | 355/72 |
| 6,549,270 B1 * | 4/2003 | Ota | 355/55 |
| 2002/0044267 A1 | 4/2002 | Ackerman et al. | 355/53 |
| 2002/0135969 A1 * | 9/2002 | Weldon et al. | 361/234 |

FOREIGN PATENT DOCUMENTS

EP 1191581 A1 3/2002

* cited by examiner

Primary Examiner—D. Rutledge
(74) Attorney, Agent, or Firm—Pillsbury Winthrop LLP

(57) ABSTRACT

A lithographic projection apparatus with a chuck in which a dielectric element of the electrostatic chuck has a specific resistivity of at least $10^{16}$ Ωcm so that once the potential difference between electrodes of the chuck is removed the force on the article to be clamped reduces below a predetermined minimum level quickly. The dielectric element also has a coefficient of thermal expansion of less than $0.02 \times 10^{-6} K^{-1}$. A method of manufacturing a chuck includes joining a first glass ceramic element with a second glass element with an electrode therebetween in which a current is passed through the second glass element.

32 Claims, 2 Drawing Sheets

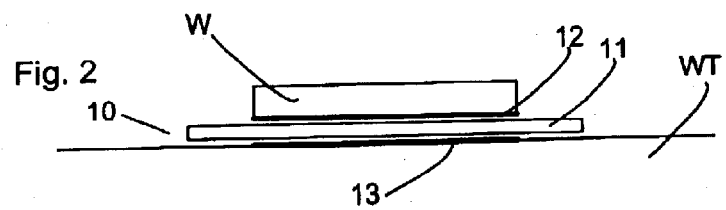
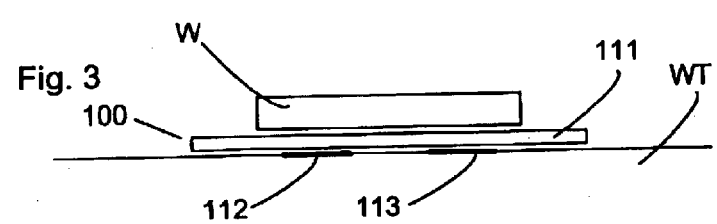
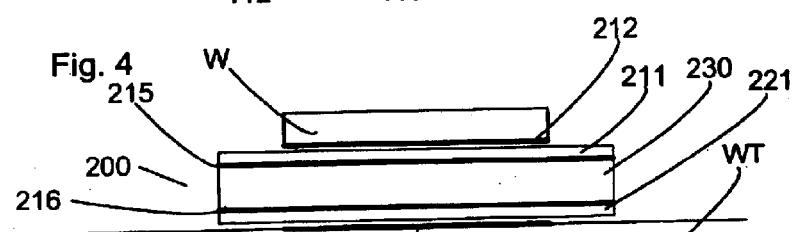
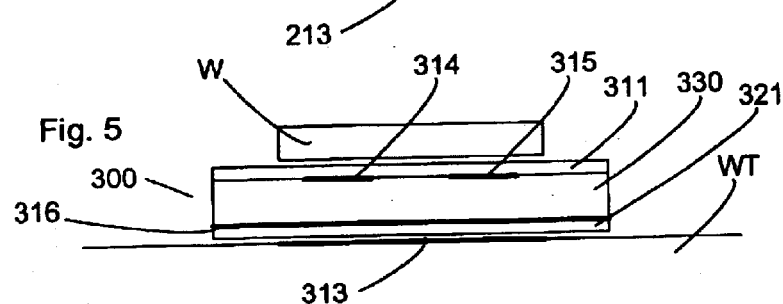
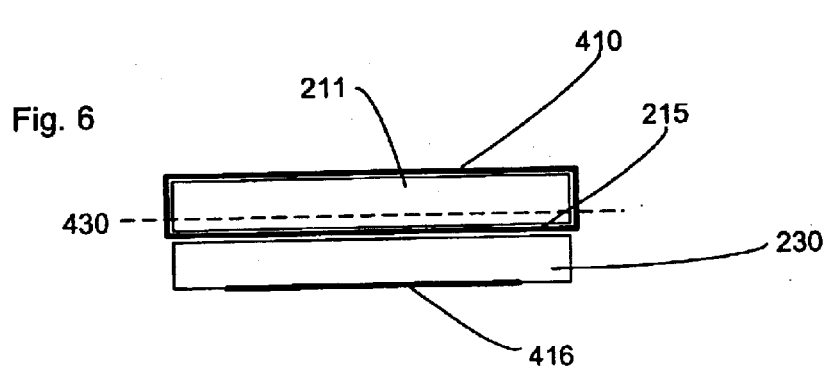

CHUCK, LITHOGRAPHIC PROJECTION APPARATUS, METHOD OF MANUFACTURING A CHUCK AND DEVICE MANUFACTURING METHOD

This application claims priority to European Patent Application 02253073.7, filed May 1, 2002, the entire contents of which are hereby incorporated by reference.

BACKGROUND OF THE INVENTION

1. Field of the Invention

The present invention relates to a chuck, a lithographic projection apparatus, a method of manufacturing a chuck and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and U.S. Pat. No. 6,262,796.

In a lithographic apparatus, it is essential that the substrate be held very rigidly on the substrate table so that its position can be accurately known even when the substrate table undergoes high accelerations during its scanning motion. In existing machines, the substrate holder, or chuck, comprises a pimpled surface surrounded by a wall. The substrate rests on the wall and pimples and the space behind it is evacuated so that air pressure above provides a strong clamping force holding the substrate in place. Further details of such a substrate holder can be found in U.S. Pat. No. 6,232,615.

The above type of substrate holder has proven effective for present day lithographic apparatus. However, to meet the ever-present demand for imaging features of reduced size, it is necessary to reduce the wavelength of the radiation used for the projection beam. Thus, while current devices use ultraviolet radiation, e.g. with a wavelength of 248 nm, 193 nm or 157 nm, improved resolution requires the development of lithographic apparatus making use of extreme ultraviolet (EUV) radiation (i.e. with a wavelength of less than about 50 nm), x-rays, electrons or ions. These proposed types of radiation all share the requirement that the beam path, or at least substantial parts of it, must be kept in vacuum. Thus, without any air pressure above the substrate, the conventional vacuum-based substrate holder cannot function.

Similar requirements also need to be met in mask writing, mask cleaning and mask inspection apparatus and so chucks suffer from the same problems as the lithographic projection apparatus.

It has therefore been proposed to use electrostatic forces to hold the substrate onto the substrate table using an electrostatic chuck. To effect this, a potential difference is applied across a dielectric material with electrodes. In one example of such an electrostatic chuck (or clamp) a potential difference is applied between an electrode on the substrate and an electrode in or on the substrate table. When the potential difference is applied, the electrode of the substrate and the electrode of the table become oppositely charged and attract each other with sufficient force to clamp the substrate in place.

U.S. Pat. No. 6,542,224 discloses a lithography stage which comprises a platen made of ULE™ on which a holder is positioned. The holder may be an electrostatic chuck as disclosed, for example, in U.S. Pat. Nos. 5,221,403, 5,835,333, or 5,835,334.

It has been found that the substrate can be difficult to remove from chuck even once the potential difference applied between the electrodes has been removed because an attractive force is still present. This can have a deleterious effect on productivity as it takes longer to load and unload substrates from their tables.

These problems are present when chucks are used for holding onto a supporting table a lithographic projection mask or mask blank in a lithographic projection apparatus, a mask handling apparatus such as a mask inspection or cleaning apparatus or a mask manufacturing apparatus. The chuck of the present invention may also be incorporated into any of those types of devices.

SUMMARY OF THE INVENTION

It is an aspect of the present invention to provide a chuck or clamp in which the substrate is easy to remove quickly after the potential difference applied between the electrodes has been removed and which has a low coefficient of thermal expansion so that unwanted variations in position due to thermal fluctuations are avoided.

This and other aspects are achieved according to the present invention in a chuck for use in holding onto a supporting table by electrostatic force a substrate to be processed in manufacturing devices employing lithographic projection techniques; or a lithographic projection mask or mask blank in a lithographic projection apparatus, a mask handling apparatus such as a mask inspection or cleaning apparatus, or a mask manufacturing apparatus, the chuck including a first dielectric member, wherein the first dielectric member has a specific resistivity of at least $10^{16}$ Ωcm and a coefficient of thermal expansion of less than 0.02× $10^{-6}K^{-1}$.

It has been found that by ensuring that the dielectric member has a specific resistivity of at least $10^{16}$ Ωcm, the residual clamping force of a chuck, after the potential difference between electrodes has been removed, falls to an acceptable level within an acceptable time period. It is believed that this is because the clamping force of the chuck is a combination of a purely capacitive attraction between the charged electrodes and the forces resulting from the Johnson-Rahbek (JR) effect.

The Johnson-Rahbek effect depends on current leakage through the dielectric element between the electrodes. The force developed by the Johnson-Rahbek effect increases with time that the potential difference between the electrodes is present. Once the potential difference between the electrodes has been removed, the force due to the Johnson-Rahbek effect decreases with time at a rate determined by the conductivity of the dielectric element and the duration of the application of a potential difference between the electrodes, i.e. the amount of current leakage that has occurred.

By using a dielectric with a specific resistance of at least $10^{16}$ Ωcm it has been found that the clamping force due to the Johnson-Rahbek effect is kept to acceptable limits for typical time periods that the potential difference is applied between the electrodes in a lithographic projection apparatus.

The dielectric member must have good optical and mechanical properties, in that it can be polished to an extremely flat surface and that it has low thermal expansion. It has been found that ULE™, a glass manufactured by Corning Incorporated, One Riverfront Plaza, Corning N.Y. 14831, meets all the necessary criteria.

Various different arrangements of electrostatic chuck are possible. These include an arrangement where the electrostatic chuck is essentially only a planar dielectric member and the first electrode is provided on the surface of the substrate in contact with the dielectric member and a second electrode is provided on the substrate table. However, more sophisticated electrostatic chucks are also possible including one where the first electrode and a second electrode are provided on a second surface of the dielectric member opposite the first surface and the first and second electrodes are in spaced apart relationship. In this way it is not necessary to coat the substrate with an electrode as it does not need to be connected to a power supply or ground. In this embodiment it is possible to make the electrostatic chuck separate from the substrate table such that it can easily be cleaned.

A separate electrostatic chuck is accomplished by the electrostatic chuck further including a core attached to the second side of the first dielectric member; a second dielectric member being attached to the core on a side opposite the first dielectric member and with a third electrode sandwiched between the core and the second dielectric member. In this case a further electrode is provided in or on the substrate table to interact with the third electrode to hold the electrostatic chuck to the substrate table.

In order to manufacture such a chuck it is necessary to attach the dielectric member and the core. The best materials for both of those parts of the electrostatic chuck are generally glasses which have the required optical and mechanical properties (flatness and low thermal expansion). As discussed above, ULE™ is one of the preferred materials for the dielectric element. The core may be made of any low thermal expansion material, for example, ZERODUR™, manufactured by Schott Glas, Hattenbergstrasβe 10 55120, Mainz, Germany. These materials are extremely difficult to join together. Gluing the two elements together is not an option as using glue is detrimental to the flatness of the first surface of the dielectric element because the Young's Modulus of glue is different to that of glass, or glass ceramic, and so if the glass (or glass ceramic) is thin and the glue thickness not uniform, stiffness variations over the surface result thereby leading to a reduction in the flatness achievable during polishing. Furthermore, use of glue can also introduce thermal expansion phenomena as the glue has too high a thermal expansion coefficient. Furthermore, glues degas strongly in vacuums. A bond made by gluing or physically bonding is not very strong if the first glass (or glass ceramic) member thickness is only a few tens of $\mu$m as that member will have lost its stiffness, which makes pealing of the thin layer possible. Physical bonding has also been tried but the bond created by such methods has been found not to be strong enough.

Therefore, it is a further aspect of the present invention to provide a method of bonding a glass or glass ceramic and a glass or a glass ceramic, and in particular a glass element and a glass ceramic element together, with an electrode between the elements which produces a bond which does not distort the members but provides a strong bond between them.

This and other aspects are achieved according to the invention in a method of manufacturing members for optical applications including a substrate, mirror or mask table or a chuck or a frame for a lithographic projection apparatus including joining together a plurality of glass or glass ceramic members using anodic bonding, wherein at least one of the members has a coefficient of thermal expansion of less than $0.1 \times 10^{-6} K^{-1}$, preferably of less than $0.02 \times 10^{-6} K^{-1}$.

In particular the method may be used to manufacture a chuck, the method including joining a glass member with a specific resistivity of at least $10^{16}$ $\Omega$cm to a glass ceramic member with an electrode therebetween, the joining including coating the glass member in a metal; placing the glass ceramic member in contact with the metal; providing an electrode on the glass ceramic member on a surface opposite the surface in contact with the metal; and applying a potential difference between the metal and the electrode thereby to drive an ion current between the metal and the electrode.

In this way it is possible to attach ULE™ to any isolator material (glass ceramic) having some conductivity (e.g. ZERODUR™ or CLEARCERAM™) with an electrode therebetween which is the preferred arrangement of electrostatic chuck for a lithographic projection apparatus. Also, as to compared to gluing or soldering the conductive metal layer may be only a few hundred nm thick, so that it has less influence on the low thermal expansion characteristics of the chuck has a whole. Furthermore, no materials with strong degassing (such as glue) are needed to make the bond between the first and second glass elements.

Although the method has been described in relation to making a chuck, the method is applicable to attaching different pieces of glass ceramic for other purposes such as manufacturing substrate or mask tables or mirrors for use in lithographic projection apparatus. Using this method complicated glass structures can easily be made from different glass parts which will not result in degassing under vacuum and will result in a structure with very low thermal expansion characteristics.

According to a further aspect of the invention there is provided a device manufacturing method including providing a substrate that is at least partially covered by a layer of radiation-sensitive material; projecting a patterned beam of radiation onto a target portion of the layer of radiation-sensitive material; providing an electrostatic chuck for holding the substrate to the substrate table, the electrostatic chuck comprising a first dielectric member, positioning the substrate on a first surface of the first dielectric member; and applying a potential difference between first and second electrodes thereby applying a potential difference across the dielectric member to generate a clamping force on the substrate, wherein the first dielectric member has a specific resistivity of at least $10^{16}$ $\Omega$cm and a coefficient of thermal expansion of less than $0.02 \times 10^{-6} K^{-1}$.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2 depicts an electrostatic chuck of the first embodiment of the present invention;

FIG. 3 illustrates an electrostatic chuck of the second embodiment of the present invention;

FIG. 4 illustrates a third embodiment of electrostatic chuck according to the present invention;

FIG. 5 illustrates a fourth embodiment of electrostatic chuck according to the present invention; and FIG. 6 illustrates a method of joining a first glass member to a second glass member with an electrode sandwiched therebetween of the present invention.

In the Figures, corresponding reference symbols indicate corresponding parts.

DETAILED DESCRIPTION

Figure 1:
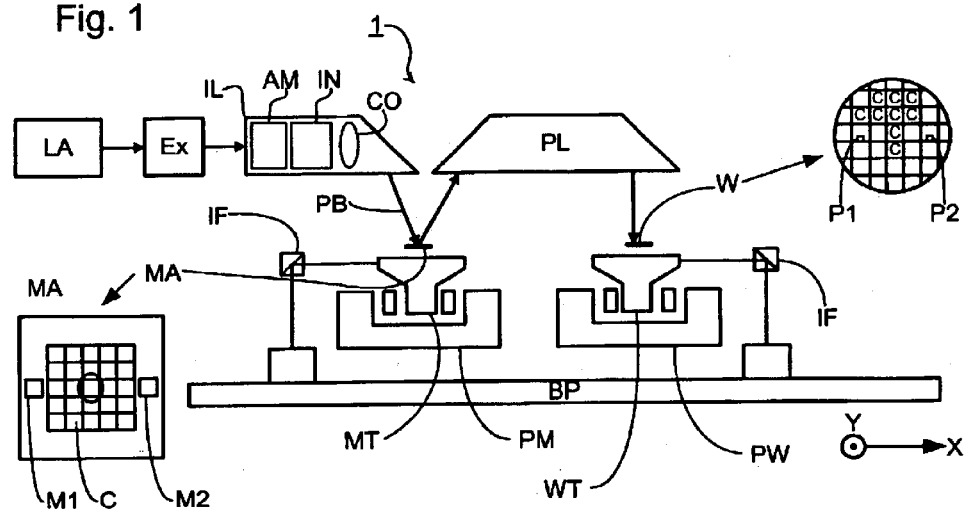
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP; a radiation system Ex. IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is nor exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Where the radiation of the beam is strongly absorbed or scattered by ambient air, as is the case with EUV, X-rays, electrons and ions, the beam path, or at least critical parts of it, mint be kept in vacuum. This can be achieved by providing a single vacuum chamber enclosing the complete apparatus 1 or by providing separate, interconnected, vacuum chambers for the necessary components, e.g. radiation system Ex, IL, the patterning device MA, the projection system PL and the substrate table WT.

FIG. 2 shows a chuck 10 according to the first embodiment of the present invention to hold the substrates W onto the substrate table WT. The chuck 10 includes a member 11 made of a dielectric material. The dielectric member 11 is planar and is polished on either side to the required flatness e.g. requiring no deviations from a perfect plane of greater than, for instance, 200 nm or even higher specification, dependent on the specific application. The dielectric member 11 should have a near zero coefficient of thermal expansion (i.e. less than $0.02 \times 10^{-6} K^{-1}$ (relative expansion/contraction per unit temperature)) so that the position of the substrate W in the apparatus 1 when held on the chuck 10 is not sensitive to temperature fluctuations in the apparatus 1.

An electrode 13 is positioned in or on the substrate table WT and another electrode 12 is positioned on the bottom surface of the substrate W which is to come into contact with a first side of the dielectric member 11. If the substrate W is made of a conductive or semi-conductive material, the electrode 12 is not required. In use, the chuck 10 is placed on a suitably prepared surface of the substrate table WT. If the substrate table WT is made of a non-conducting material, this surface can have applied thereto a suitable electrode 13. The substrate W is then placed on top of the chuck 10. To hold the substrate W in place, a power supply is used to apply a potential difference V, between the electrode 12 of the substrate W and electrode 13 of the substrate table WT. The electrode 12 of the substrate W and the electrode 13 will act as a capacitor and accordingly will experience an attractive force when the potential differences are applied between them. This force F is given by:

$$\frac{F}{A} = \frac{\varepsilon_0}{2} \times \left(\frac{\varepsilon_r \cdot V}{(\varepsilon_r \cdot g + d)}\right)^2, \quad (1)$$

wherein A is the area of the effective capacitor, d the thickness of the dielectric layer between the electrodes, $\varepsilon_r$ the relative permittivity of the dielectric and g the thickness of any air gaps that will inevitably be present between the conducting surfaces of the chuck 10 and the substrate W and substrate table WT. This equation can be derived by regarding the air gap and the dielectric material as capacitors in series. The dielectric member 11 preferably has as thickness of between 5 and 500 $\mu$m, preferably in the region of about 100 $\mu$m.

Because the first surface of dielectric member 11 has a certain surface roughness, the wafer W does not make contact over the entire surface but only with a small portion of the atoms at the surface. Because only a small amount of the surface makes contact there is a surface resistance across the interface. This results in a potential drop across the interface. If a small current I is allowed to flow in the dielectric material, this small potential difference gives rise to the build up of opposite charges in the area of the interface where there is no contact. These opposite charges will attract one another providing a further clamping force due to the Johnson-Rahbek effect, which can be quite large because of the small distances of the air gap, of the order of 10 nm.

The force associated with the Johnson-Rahbek effect increases with time that the potential difference is applied. When the potential difference is removed from the electrodes a residual force will gradually decrease with time. This can be awkward in a lithographic projection apparatus as the electrostatic chuck cannot be turned on and off instantaneously to hold the substrate W or allow it to be removed, if the force of the Johnson-Rahbek effect is too great. If the Johnson-Rahbek force is allowed to increase too much, either by allowing a too high a current leakage through the dielectric member 11 or by applying the potential difference between electrodes for a long time, then this can adversely effect the productivity of the lithographic projection apparatus 1 as when removing the substrate W from the substrate table WT it is necessary to wait for the Johnson-Rahbek force to decrease to a level at which the substrate may be removed from the electrostatic chuck.

It has been found that by ensuring that the specific resistivity of the dielectric material is at least $10^{16}$ $\Omega$cm, the Johnson-Rahbek force never reaches high enough levels to detrimentally effect the productivity of the lithographic apparatus for typical lengths of time of holding a substrate W as the clamping force falls to a predetermined level quickly. Unfortunately few materials with near zero coefficient of thermal expansion (i.e. less than $0.02 \times 10^{-6} K^{-1}$) have such a high specific resistivity.

A specific RC time for JR clamping can be calculated based on an estimated interface capacity and resistance. This RC time is very dependent on the specific volume resistivity of the dielectric material. The build up and removal of JR forces is governed by the RC time for JR clamping. It is therefore important to chose the resistance of the dielectric material such that a very short RC time is created (0.1s) or a very long one (several days).

In the first case a JR chuck is created with strong forces and in the second case a capacitive/coulombic chuck where the JR forces are absent as much as possible. A value of specific resistivity of more than $10^{16}$ $\Omega$cm creates for a 10 $\mu$m thick dielectric material an RC time of several hours, while the resistivity of ULE™ at room temperature creates an RC time of several days.

Preferably the specific resistivity of the dielectric member is at least $10^{17}$ $\Omega$cm. The material of the dielectric member is preferably also one which has good optical/mechanical properties, in that it can be polished to a high flatness and one which preferably has a very low coefficient of thermal expansion i.e. even as low as $0.015 \times 10^{-6} K^{-1}$ or $0.01 \times 10^{-6} K^{-1}$. A suitable class of material are glass ceramics. Glass ceramics are a combination of a glass and a ceramic material; they are neither a glass nor a ceramic material. ULE™, a glass manufactured by Corning Incorporated, has also been found to meet all of the criteria. This is a material based on $SiO_2$ with $TiO_2$ present in a quantity of about 7 wt %. Other low expansion materials (including glasses and glass ceramics) which may also be suitable are based on $SiO_2$ and at least one alkaline metal oxide such as $Na_2O$, $Li_2O$ or $K_2O$.

It has been found that while ULE™ produces satisfactory results in terms of limiting the force due to the Johnson-Rahbek effect, ZERODUR™ ($SiO_2$ with 2.5% Li and 0.5% Na), with a specific resistivity of $3.10^{13}$ $\Omega$cm does not produce satisfactory results and neither does CLEARCERAM™ (Li doping only) available from Clearceram-Z of OHARA Inc, 15–30 Oyama 1-chome, Sagamihara-Shi, Kanagawa, 229–1186, Japan, which has a specific resistivity of $5.10^{12}$ $\Omega$cm.

ULE™ has a specific resistivity of about $10^{18}$ $\Omega$cm and a coefficient of thermal expansion of less than $0.01 \times 10^{-6} K^{-1}$. However, other materials may also be used as the dielectric member 11 of the electrostatic chuck 10 as long as the specific resistivity is below $10^{16}$ $\Omega$cm. Glass ceramics are the most promising class of materials in this regard.

To minimize the stray fields in the apparatus, which is particularly desirable where charged particles are used as the projection beam radiation, the substrate W and electrode 12 on the back of the substrate W can be grounded and the electrode 13 on the substrate table WT charged to a different potential.

It should also be noted that the chuck 10 of the present invention may also be used to clamp masks MA to a mask table MT. For reflective masks, the chuck can have the same shape as the mask, e.g. square, rectangular or round, whereas for a transmissive mask, the chuck of the invention may have the form of a frame with a central opening corresponding to the pattern area.

The chuck 10 of the first embodiment may be permanently attached to the substrate table WT so that when the potential difference between electrodes 12 and 13 is removed, as well as the substrate W being removable from the chuck 10, the chuck 10 is removable from the substrate table WT. That is, there is no separate control for releasing one without the other.

In an alternative embodiment (not illustrated), a further electrode may be embedded in the dielectric member 11 such that a voltage difference between that embedded electrode and the electrode 13 in the substrate table WT can be used to control the attachment of the electrostatic chuck to the substrate table WT and the potential difference between the embedded electrode in the dielectric member 11 and the electrode 12 attached to the bottom of the substrate W can be used to control the clamping force between the electrostatic chuck 10 and the substrate W.

The chuck 100 of the second embodiment of the present invention (which is a bipolar or multipolar chuck), illustrated in FIG. 3, includes a dielectric member 111 which is attached to the substrate table WT. Sandwiched between the dielectric member 111 and the substrate table WT are two electrodes 112, 113 which are in the same plane but are separate (i.e. in spaced apart relationship) from one another. In this way, the substrate W does not require an electrode or electrical contact to be applied to its bottom surface as it does not need to be connected to ground or a high voltage supply. Instead, by applying potential difference between the first electrode 112 and the second electrode 113 the substrate W may be held to the dielectric element 111. The requirements of the dielectric element 111 are the same for the second embodiment as they are for the first embodiment.

The chuck 200 of the third embodiment is illustrated in FIG. 4. The electrostatic element of the third embodiment is separate from the substrate table WT. The chuck 200 includes a core 230 either side of which is attached a (first or second) dielectric member. 211, 221 with a first or second electrode 215, 216 sandwiched between the core 230 and each of the dielectric members 211, 221. In this way, a potential difference between the second electrode 216 sandwiched between the core 230 and the second dielectric member 221 and an electrode 213 in or on the substrate table WT can be applied to hold the chuck 200 to the substrate table WT. A potential difference applied between the first electrode 215 of the chuck 200 and an electrode 212 applied to the bottom of the wafer W can be used to hold the wafer to the chuck 200. In the third embodiment the dielectric members 211, 221 need the same physical properties as the dielectric members of the first and second embodiments. The core 230 is preferably made of a near zero thermal expansion material such as ZERODUR™, though any other glass ceramics with some conductivity may be used (e.g. CLEARCERAM™).

A fourth embodiment of the present invention is illustrated in FIG. 5. The chuck 300 of the fourth embodiment includes first and second dielectric members 311, 321 and a core 330. An electrode 313 is in the substrate table WT and an electrode 316 is at the bottom of the chuck 300. A first and second electrode 314, 315 are sandwiched between the core 330 and first (the top as illustrated) dielectric member 311 of the chuck 300. The first and second electrodes 314, 315 are in the same plane but are separate from each other and they function to provide a force on the substrate W. The fourth embodiment has the advantages of a separate chuck (e.g. for cleaning) and also of not requiring an electrode to be applied to the bottom surface of the substrate W.

The first (upper as illustrated) surface of the first dielectric member 11, 111, 211, 311 of the chuck onto which the substrate W is placed may be provided with burls (or pimples). The burls have a total surface area that is a small fraction of the total surface area of the substrate W so that there is a high probability that any contaminant particle that adheres to the substrate W or to the electrostatic chuck will lie between the burls. In that case, the contaminant particle will not cause a deformation of the substrate W unless it is larger than the width of the gap by which the burls raise the substrate W above the electrostatic chuck. Even if a contaminant particle is larger than the gap, its effect is reduced.

As described above, some embodiments of electrostatic chuck require bonding between the dielectric member 111, 211, 311, 221, 321 and the substrate table WT or the core 230, 330. Each of those components is preferably made of a low coefficient of thermal expansion material. Such materials are often glass like and can be difficult to join together accurately without deformation.

In the chuck of the present invention it is necessary to provide an electrode between the dielectric element 111, 211, 221, 311, 321 and the substrate table WT or core 230, 330. It is possible to make such a bond with the high degree of accuracy required and without introducing further materials such as glue or solder and which also produces a very strong molecular/chemical bond as described below.

The method of joining the two glass ceramic elements will be described with reference to FIG. 6. The method will be described with reference to joining ULE™ and ZERODUR™ with an aluminium layer of about 300 nm thickness between the two elements. The process may be used to join other types of glass ceramic with different thickness and metal layer material.

The method is described in relation to the production of a chuck according to the third embodiment of the present invention illustrated in FIG. 4. It should be noted that the method is equally applicable to manufacturing substrate, mirror or mask tables for a lithographic projection apparatus. For the chuck of the third embodiment, the final thickness of the various layers are 100 $\mu$m for the dielectric members 211, 221, 300 nm for the 2 electrodes 215, 216 which are made of aluminium and about 2 mm of ZERODUR™ as the core 230. With these dimensions the aluminium electrode 215, 216 is too thin to have an influence on the near zero thermal expansion characteristics of the entire chuck 200.

The first step is to polish the blocks of ULE™ dielectric members 211 to the required degree of surface finish. The actual thickness of the block is unimportant because, as will be described later, the block of dielectric member 211 is ground to the correct thickness as a final step. Once the dielectric member 211 has been polished to a satisfactory finish, it is coated with an aluminium coating 410 with a thickness of about 300 nm. The coating has been illustrated as covering the whole surface of the dielectric member 211. Of course, this is not necessary and only the interface surface need be coated. One way of coating the aluminium on the ULE™ is by vapour deposition though other methods, such as spraying or immersing are also possible. Of course other metals than aluminium may also be used. Also more than one layer for e.g. a stronger metal coating, may be used.

The next step is for the core 230 to be polished. In the embodiment the core is made of ZERODUR™ or CLEARCERAM™, i.e. materials which are capable of being anodically bonded and which have the required low thermal expansion characteristics.

The block of coated dielectric material 211 is then brought into contact with a surface of the core 230 to which the dielectric material is to be attached. On the side of the core 230 opposite to the dielectric member 211 an anode must be attached. This is most easily achieved by using silver paint 416 on the surface of the ZERODUR™. The assembly is then heated to about 300° C. though the temperature may be as low as 150° C. at the expense of longer bonding time or as high as 350° C. The exact temperature is chosen according to the material and its thickness as described below.

Once the assembly has reached 300° C. a potential difference is applied between the coating 410 on the dielectric element 211 and the silver paint 416 on the other side of the core 230. The coating 410 is used as the anode and the silver paint 416 is used as the cathode. The temperature is chosen so that a current of at least 0.01 mA/cm² is allowed to flow in the material. For ZERODUR™ this means between 275 to 300° C. depending on the thickness.

ZERODUR™ contains about 2.5 weight percent Li⁺ ions and 0.5 weight percent Na⁺ ions, both are alkaline metals and both take part in the ion current in the ZERODUR™ in this method. The other low expansion material ULE™ has no alkaline ions but is comprised of $SiO_2$ doped with about 7 weight percent of $TiO_2$. Thus, the specific resistivity of ULE™ is about 5 orders lower than ZERODUR™, $10^{18}$ Ωcm as compared to $10^{13}$ Ωcm (at room temperature).

Thus, on application of the potential across the ZERODUR™, the positively charged Li and Na ions are attracted towards the side of the core 230 closest to the negative electrode 416. This has the effect of depleting positive alkali atoms from the interface of the core 230 and the coating 410 of the dielectric member 212. A negative charge density in the form of $O^{2-}$ ions is formed at the interface between the core 230 and the coating 410. This induces charges in the Al and the Al is oxidized to $Al^{3+}$ ($Al \rightarrow Al^{3+}+3e^-$) in the coating 410 and a very strong electrostatic attractive force is formed between the core 230 and the coating 410. The electrostatic force/pressure obtained with 150 volts is about 1 bar with a 1 $S_Bm$ gap. In reality the gap is likely to be smaller than this and the voltages also larger so a larger pressure than 1 bar is to be expected. The large force presses the two materials at the interface together and a molecular contact between the material of the core 230 and the material of the coating 410 is created.

With the aluminium in contact with the negatively charged layer of ZERODUR™, there is a driving force for the $Al^{3+}$ to move toward the ZERODUR™ and the $O^{2-}$ to move towards the Al coating and a bonding layer between the metal of the coating 410 and the ZERODUR™ is created. It is thought that, in the crystal structure of the ZERODUR™ of the core 230, the aluminium replaces the alkali ions which have migrated towards the painted silver electrode 416.

After the potential difference between the electrodes has been removed, the assembly must be cooled at a rate of at most 0.1 K/min for the ZERODUR™ to maintain the low coefficients of thermal expansion.

Once cooled, the ULE™ dielectric member 211 may be machined to the correct dimensions 430. The ZERODUR™ core 230 may also be machined to the correct dimensions.

The method of bonding described above is most successful if the current in the core is at least 0.01 mA/cm². 0.01 mA/cm² for 1000 seconds or 5000 seconds leads to a charge accumulated of 10 mC/cm² (for a minimum bond) to 50 mC/cm² (for a standard bond) respectively. A charge of 10 mC/cm² leads to about 14 atomic layers of the Al layer being oxidized to $Al^{3+}$.

Table 1 illustrates the conditions of three experiments which resulted in successful bonds between a aluminium layer and a block of ZERODUR™. The important factors are the temperature (higher temperature leads to a quicker bonding process), the voltage applied (a higher voltage leads to a larger current and thus less time for bonding to take place) and of course the time of application of potential difference which determines the amount of alkali depletion and amount of aluminium oxidation and thus bond formation. Also important are the surface quality of the core 230 and the coating 410 and the linear expansion coefficients, thickness of the aluminium layer and type of metal are also important.

TABLE 1

| Experiment No. | Thickness of Al ($S_Bm$) | Temperature (BC) | Voltage applied (V) | Time (Minutes) | Current (mA) |
|---|---|---|---|---|---|
| 1 | Several mm | 250 | 1000 | 15 | 1.08 at first decreasing to 0.12 |
| 2 | Several mm | 250 | 2000 increased in 100 volt steps | 50 | Final current = 0.3 mA |
| 3 | 300 nm | 275 | 1500 increased in 200 volt steps | 40 | Final current = 0.2 mA |

In all three experiments, a sufficiently strong bond between the aluminium and the ZERODUR™ was created. In experiment 3 the aluminium had been coated on a block of ULE™ as described above. Sample 3 had the layer of ULE™ ground away to reduce its thickness. The ULE™ was successfully thinned to a thickness of 200 µm.

In another embodiment of the present invention, instead of painting a silver electrode 416 on the core 230, a second dielectric member 221 also coated in aluminium 420 may be placed on the side of the core 230 opposite the first dielectric member 212. Thus, the coating 420 on the second dielectric element 221 is used as the second electrode in the process in which AC is used.

Other methods are also suitable for manufacturing the chuck and in particular joining dielectric layers to the core. One method is simply gluing.

In another method of joining, after polishing (e.g. by plasma cleaning), the ZERODUR™ is coated with a thin layer of Cr to a thickness of 20–50 nm. Optionally a $SiO_2$ layer is coated onto the Cr layer before the ULE™ is physically bonded onto the outer layer (Cr or $SiO_2$) using wringing.

While specific embodiments of the invention have been described above, it will be appreciated that the invention may be practiced otherwise than as described. The description is not intended to limit the invention.

What is claimed is:

1. A chuck for use in holding onto a supporting table by electrostatic force a substrate to be processed in manufacturing devices employing lithographic projection techniques or a lithographic projection mask or a mask blank in a lithographic projection apparatus, a mask handling apparatus such as a mask inspection or cleaning apparatus, or a mask manufacturing apparatus, the chuck comprising:
   a first dielectric member, wherein the first dielectric member has a specific resistivity of at least $10^{16}$ Ωcm and a coefficient of thermal expansion of less than $0.02 \times 10^{-6} K^{-1}$.

2. A chuck according to claim 1, wherein the specific resistivity of the first dielectric member as at least $10^{17}$ Ωcm.

3. A chuck according to claim 1, wherein the first dielectric member has a thickness of between 5 and 500 µm.

4. A chuck according to claim 1, wherein the first dielectric member is made of a material comprising $SiO_2$ containing $TiO_2$ in a quantity of less than 10 wt %.

5. A chuck according to claim 1, wherein the first dielectric member is made of a glass material.

6. A chuck according to claim 1, wherein a first electrode is provided on a first surface of the first dielectric member.

7. A chuck according to claim 1, wherein a first electrode and a second electrode are provided on a first surface of the first dielectric member in spaced apart relationship.

8. A chuck according to claim 7, wherein the chuck further comprises a core attached to the first side of the first dielectric member; a second dielectric member attached to the core on a side opposite the first dielectric member, and a third electrode between the core and the second dielectric member.

9. A chuck according to claim 8, wherein the core is made of a glass ceramic material.

10. A chuck according to claim 9, wherein at least one of the first and second dielectric member is joined to the core by ion exchange between the core and the first or third electrode effected by application of a potential difference between the first and third electrodes.

11. A chuck according to claim 10, wherein at least one of the first and second dielectric member is coated with metal before being joined to the core, the metal forming the first or third electrode.

12. A chuck according to claim 10, wherein at least one of the first and second dielectric member was joined to the core at between 150–350° C.

13. A chuck according to claim 1, wherein the chuck is arranged for applying a potential difference across the first dielectric member.

14. A lithographic projection apparatus, comprising:
a radiation system constructed and arranged to provide a beam of radiation;
a support structure constructed and arranged to support a patterning device, the patterning device constructed and arranged to pattern the beam according to a desired pattern;
a substrate table constructed and arranged to hold a substrate;
a projection system constructed and arranged to project the patterned beam onto a target portion of the substrate;
a chuck according in claim 1 on the support structure or the substrate table; and
at least a first electrode for applying a potential difference across the first dielectric member of the chuck thereby to generate a clamping force.

15. An apparatus according to claim 14, wherein the electrostatic chuck is separate from the substrate table or support structure and a further electrode is provided in or on the substrate table or support structure.

16. An apparatus according to claim 14, wherein the electrostatic chuck is part of the substrate table or support structure.

17. A method of manufacturing members for optical applications including a substrate, minor or mask table or a chuck or a frame for a lithographic projection apparatus, the method comprising:
joining together a plurality of glass or glass ceramic members using anodic bonding, wherein at least one of the members has a coefficient of thermal expansion of less than $0.1\times10^{-6}K^{-1}$.

18. A method according to claim 17, wherein the joining comprises joining a first of the members to a second of the members with an electrode therebetween, the joining also comprising:
coating the first member in a metal;
placing the second member in contact with the metal;
providing an electrode on the second member on a surface opposite the surface in contact with the metal; and
applying a potential difference between the metal and the electrode thereby to drive an ion current between the metal and the electrode.

19. A method according to claim 18, wherein the method is a method of manufacturing a chuck and the first member is a glass member with a specific resistivity of at least $10^{x}\Omega cm$ and the second member is a glass ceramic member.

20. A method according to claim 18, further comprising polishing the first member before the coating.

21. A method according to claim 18, wherein the coating comprises vapor deposition.

22. A method according to claim 18, further comprising polishing the second member before the placing.

23. A method according to claim 18, wherein the providing comprises placing a third glass member which has been coated in a metal on the second member.

24. A method according to claim 18, further comprising, after the providing, elevating the temperature of the first and second members, wherein the applying occurs at the elevated temperature.

25. A method according to claim 23, further comprising, after the providing, elevating the temperature of the first, second and third members, wherein the applying occurs at the elevated temperature.

26. A method according to claim 24, wherein the temperature is elevated to between 150–350° C.

27. A method according to claim 25, wherein the temperature is elevated to between 150–350° C.

28. A method according to claim 18, further comprising cooling the members at a rate of between −0.01 to −1.0 K/min.

29. A method of manufacturing an electrostatic chuck, comprising;
the method of claim 17; and
machining away the coating of metal of the first member not covered by the second member.

30. A device manufacturing method, comprising:
projecting a patterned beam of radiation onto a target portion of a layer of radiation-sensitive material at least partially covering a substrate;
providing an electrostatic chuck for holding the substrate to a substrate table, the electrostatic chuck comprising a first dielectric member;
positioning the substrate on a first surface of the first dielectric member; and
applying a potential difference between first and second electrodes thereby applying a potential difference across the dielectric member to generate a clamping force on the substrate, wherein the first dielectric member has a specific resistivity of at least $10^{16}$ $\Omega cm$ and a coefficient of thermal expansion of less than $0.02\times10^{-6}K^{-1}$.

31. A chuck according to claim 1, wherein the first dielectric member is made of a glass ceramic material.

32. A chuck according to claim 31, wherein the glass ceramic material comprises $SiO_2$ and at least one alkaline metal oxide selected from $Na_2O$, $Li_2O$ and $K_2O$.

* * * * *